(12) United States Patent
Shin et al.

(10) Patent No.: US 9,142,780 B2
(45) Date of Patent: Sep. 22, 2015

(54) DISPLAY DEVICE AND METHOD FOR MANUFACTURING THE SAME

(71) Applicant: SAMSUNG DISPLAY CO., LTD., Yongin, Gyeonggi-Do (KR)

(72) Inventors: Min-Chul Shin, Yongin (KR); Jong-Moo Huh, Yongin (KR); Bong-Ju Kim, Yongin (KR); Yun-Gyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 14/049,119

(22) Filed: Oct. 8, 2013

(65) Prior Publication Data

US 2014/0038333 A1 Feb. 6, 2014

Related U.S. Application Data

(62) Division of application No. 13/084,741, filed on Apr. 12, 2011, now Pat. No. 8,563,978.

(30) Foreign Application Priority Data

Jun. 9, 2010 (KR) ................... 10-2010-0054405

(51) Int. Cl.
*H01L 21/00* (2006.01)
*H01L 51/00* (2006.01)
(Continued)

(52) U.S. Cl.
CPC ........ *H01L 51/0023* (2013.01); *H01L 27/1255* (2013.01); *H01L 27/1288* (2013.01);
(Continued)

(58) Field of Classification Search
CPC .................. H01L 51/5203; H01L 27/3262
See application file for complete search history.

(56) References Cited

U.S. PATENT DOCUMENTS 6,236,062 B1   5/2001   Nakahori et al.
7,420,212 B2 * 9/2008   Kim et al. .................. 257/72
(Continued)

FOREIGN PATENT DOCUMENTS

CN   1693972 A   11/2005
CN   101159273 A   4/2008
(Continued)

OTHER PUBLICATIONS

[On Order] SIPO Office Action dated Jan. 30, 2015 of the corresponding Chinese Patent Application No. 201110103411.X, noting listed references in this IDS.
(Continued)

*Primary Examiner* — Yu-Hsi D Sun
(74) *Attorney, Agent, or Firm* — Christie, Parker & Hale, LLP

(57) ABSTRACT

A display device includes a substrate, a first conductive film pattern including a gate electrode and a first capacitor electrode on the substrate, a gate insulating layer pattern on the first conductive film pattern, a polycrystalline silicon film pattern including an active layer and a second capacitor electrode on the gate insulating layer pattern, an interlayer insulating layer on the polycrystalline silicon film pattern, a plurality of first contact holes through the gate insulating layer pattern and the interlayer insulating layer to expose a portion of the first conductive film pattern, a plurality of second contact holes through the interlayer insulating layer to expose a portion of the polycrystalline silicon film pattern, and a second conductive film pattern including a source electrode, a drain electrode, and a pixel electrode on the interlayer insulating layer.

19 Claims, 13 Drawing Sheets

(51) Int. Cl.
*H01L 51/52* (2006.01)
*H01L 27/32* (2006.01)
*H01L 27/12* (2006.01)

(52) U.S. Cl.
CPC ........ *H01L27/3244* (2013.01); *H01L 27/3262* (2013.01); *H01L 51/5203* (2013.01); *H01L 2227/323* (2013.01)

(56) References Cited

U.S. PATENT DOCUMENTS

| | | | |
|---|---|---|---|
| 8,305,508 B2 | 11/2012 | Lin | |
| 2003/0227021 A1* | 12/2003 | Yamazaki et al. | 257/83 |
| 2005/0134754 A1 | 6/2005 | Yang et al. | |
| 2005/0242352 A1 | 11/2005 | Jeoung et al. | |
| 2006/0141685 A1 | 6/2006 | Kim et al. | |
| 2007/0188089 A1 | 8/2007 | Choi et al. | |
| 2008/0083927 A1 | 4/2008 | Nishiura et al. | |
| 2008/0296574 A1 | 12/2008 | Cheng et al. | |
| 2009/0256477 A1* | 10/2009 | Chung et al. | 313/505 |
| 2011/0114960 A1* | 5/2011 | Lee et al. | 257/71 |
| 2011/0169761 A1 | 7/2011 | Sakai et al. | |

FOREIGN PATENT DOCUMENTS

| | | |
|---|---|---|
| KR | 1020050113413 A | 12/2005 |
| KR | 1020060075587 A | 7/2006 |
| KR | 1020090073479 A | 7/2009 |

OTHER PUBLICATIONS

SIPO Office Action dated Jan. 30, 2015 of the corresponding Chinese Patent Application No. 201110103411.X (11 pages).

* cited by examiner

DISPLAY DEVICE AND METHOD FOR MANUFACTURING THE SAME

CROSS-REFERENCE TO RELATED APPLICATION

This divisional patent application claims priority to and the benefit of U.S. patent application Ser. No. 13/084,741, filed Apr. 12, 2011, which claims priority to and the benefit of Korean Patent Application No. 10-2010-0054405 filed in the Korean Intellectual Property Office on Jun. 9, 2010, the entire contents of which are incorporated herein by reference.

BACKGROUND

1. Field

The described technology relates to a display device and a method of manufacturing the same.

2. Description of Related Art

Most flat panel display devices, such as organic light emitting diode (OLED) displays, liquid crystal displays (LCDs), and the like, are manufactured through several thin film processes. The thin film processes involve patterning a thin film through photolithography using a mask.

In particular, when a display device includes low-temperature polycrystalline silicon thin film transistors (LTPS TFTs), the display device is manufactured through a relatively larger number of thin film processes. With the advantages of having good carrier mobility, LPTS TFTs can be applicable to high speed operational circuits and can be used for CMOS circuits. Accordingly, LPTS TFTs are commonly used.

However, as display devices are increased in size, the number of masks used for manufacturing processes are increased, thereby reducing productivity.

The above information disclosed in this Background section is only for enhancement of understanding of the background of the described technology, and may therefore contain information that does not form the prior art that is already known in this country to a person of ordinary skill in the art.

SUMMARY

Aspects of embodiments of the present invention provide a display device having a simpler structure allowing for a reduction of time required for a manufacturing process.

Aspects of embodiments of the present invention also provide a method for manufacturing the foregoing display device.

An exemplary embodiment of the present invention provides a display device including a substrate, a first conductive film pattern including a gate electrode and a first capacitor electrode on the substrate, a gate insulating layer pattern on the first conductive film pattern, a polycrystalline silicon film pattern including an active layer and a second capacitor electrode on the gate insulating layer pattern, an interlayer insulating layer on the polycrystalline silicon film pattern, a plurality of first contact holes through the gate insulating layer pattern and the interlayer insulating layer to expose a portion of the first conductive film pattern, a plurality of second contact holes through the interlayer insulating layer to expose a portion of the polycrystalline silicon film pattern, and a second conductive film pattern including a source electrode, a drain electrode, and a pixel electrode on the interlayer insulating layer, wherein the gate insulating layer pattern, except for the plurality of first contact holes, has substantially the same pattern as the first conductive film pattern.

Impurities may be doped on the polycrystalline silicon film pattern exposed through the plurality of second contact holes.

The impurities may include P-type impurities or N-type impurities.

The first conductive film pattern may include a first metal layer, and the second conductive film pattern may include a transparent conductive layer and a second metal layer on a partial area of the transparent conductive layer.

The source electrode and the drain electrode may each include a portion of the transparent conductive layer and a portion of the second metal layer, and the pixel electrode may include a portion of the transparent conductive layer.

The first conductive film pattern may further include at least one of a data line or a common power line, and the second conductive film pattern may further include a gate line.

The display device may further include a pixel defining film on the second conductive film pattern and having an opening exposing a portion of the pixel electrode, an organic light emission layer on the pixel electrode, and a common electrode on the organic light emission layer.

The interlayer insulating layer may include a first interlayer insulating layer and a second interlayer insulating layer having a different refractive index from that of the first interlayer insulating layer.

The interlayer insulating layer may include one or more of inorganic films and organic films.

Another embodiment of the present invention provides a method of manufacturing a display device including sequentially stacking a first metal layer, a gate insulating layer, and a polycrystalline silicon film on a substrate, patterning the polycrystalline silicon film, the gate insulating layer, and the first metal layer through a photolithography process using a single mask to pattern a polycrystalline silicon film pattern, a gate insulating layer pattern, and a first conductive film pattern, placing an interlayer insulating layer on the polycrystalline silicon film pattern, sequentially stacking a transparent conductive layer and a second metal layer on the interlayer insulating layer, and patterning the transparent conductive layer and the second metal layer as a second conductive film pattern.

The first conductive film pattern may include a gate electrode and a first capacitor electrode, the polycrystalline silicon film pattern may include an active layer and a second capacitor electrode, and the second conductive film pattern may include a source electrode, a drain electrode, and a pixel electrode.

The source electrode and the drain electrode may each include a portion of the transparent conductive layer and a portion of the second metal layer, and the pixel electrode may include a portion of the transparent conductive layer.

The first conductive film pattern may further include at least one of a data line or a common power line, and the second conductive film pattern may further include a gate line.

The gate insulating layer pattern and the interlayer insulating layer may have a plurality of first contact holes exposing a portion of the first conductive film pattern, and the interlayer insulating layer may have a plurality of second contact holes exposing a portion of the polycrystalline silicon film pattern.

The gate insulating layer pattern, except for the plurality of first contact holes, may have substantially the same pattern as the first conductive film pattern.

The method of manufacturing a display device may further include doping impurities on the polycrystalline silicon film pattern exposed through the plurality of second contact holes.

The impurities may include P-type impurities or N-type impurities.

The doping impurities may include doping using an ion implantation process.

The doping impurities may include depositing an aluminum (Al) metal film, or dusting aluminum (Al) metal particles, on the polycrystalline silicon film pattern exposed through the plurality of second contact holes, and performing a thermal treatment on the aluminum metal film or the aluminum metal particles.

A temperature of the thermal treatment may range from about 200 degrees Celsius to about 400 degrees Celsius.

The method of manufacturing a display device may further include removing the aluminum metal film or the aluminum metal particles.

The method of manufacturing a display device may further include forming a protective layer to cover the aluminum metal film or the aluminum metal particles before performing the thermal treatment to reduce oxidization of the aluminum metal film or the aluminum metal particles.

The protective layer may include molybdenum (Mo).

The depositing the aluminum metal film, or dusting the aluminum metal particles, the polycrystalline silicon film pattern exposed through the plurality of second contact holes may include one or more of atomic layer deposition (ALD), chemical vapor deposition (CVD), and sputtering.

The photolithography process may include a dual-exposure process or a halftone exposure process.

The method of manufacturing a display device may further include forming a pixel defining film having an opening exposing a portion of a pixel electrode on the second conductive film pattern, forming an organic light emission layer on the pixel electrode, and forming a common electrode on the organic light emission layer.

The interlayer insulating layer may include a first interlayer insulating layer and a second interlayer insulating layer having a different refractive index from that of the first interlayer insulating layer.

The interlayer insulating layer may include one or more of inorganic films and organic films.

According to exemplary embodiments of the present invention, the display device has a simpler structure, so the number of processes for manufacturing the display device can be reduced.

DETAILED DESCRIPTION

Figure 1:
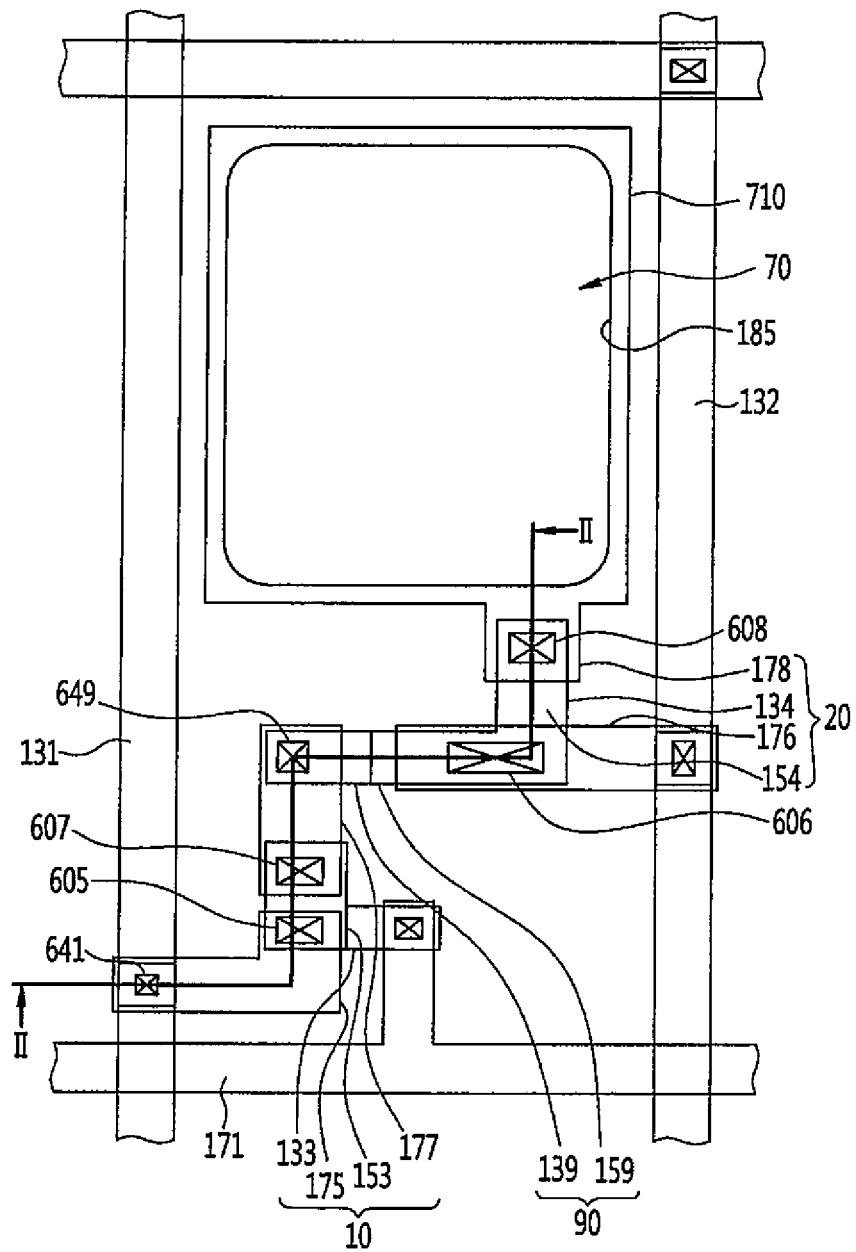
FIG. 1 is a layout view of a display device according to a first exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify embodiments of the present invention, the same elements or equivalents are referred to by the same reference numerals throughout the specification. In exemplary embodiments other than the first exemplary embodiment, configurations different from those of the first exemplary embodiment will be described.

The size and thickness of each element are arbitrarily shown in the drawings, and are not necessarily to scale, and the present invention is not necessarily limited thereto.

In the drawings, the thickness of layers, films, panels, regions, etc., are magnified for clarity. Also, in the drawings, the thickness of layers, films, panels, regions, etc., may be exaggerated for the sake of explanation. It will be understood that when an element such as a layer, film, region, or substrate is referred to as being "on" another element, it can be directly on the other element or intervening elements may also be present. Also, when an element is referred to as being "coupled to" or "connected to" another element, it can be directly connected to the element, or indirectly connected to the element with one or more intervening elements therebetween.

Figure 2:
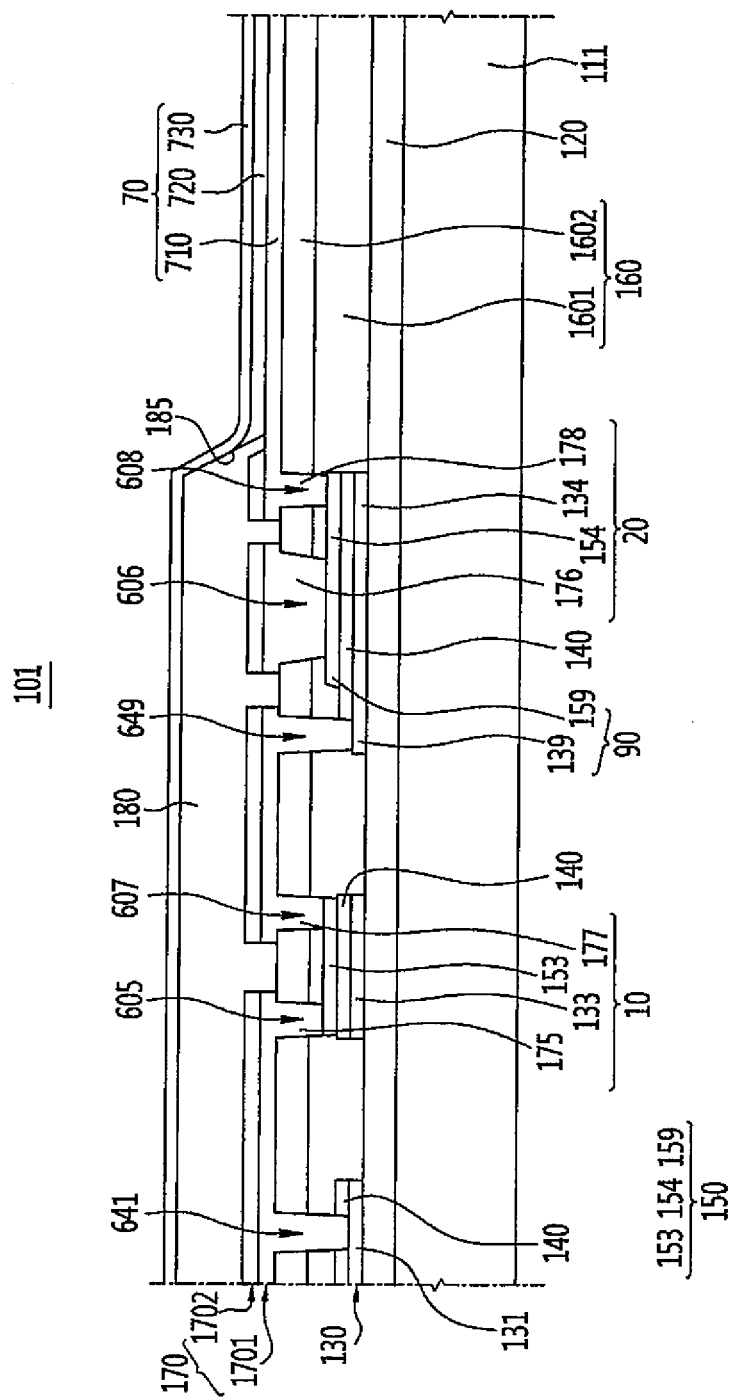
FIG. 2 is a cross-sectional view of the display device of the first exemplary embodiment of the present invention taken along the line II-II of FIG. 1.

A display device 101 according to a first exemplary embodiment of the present invention will now be described with reference to FIGS. 1 and 2. In FIGS. 1 and 2, an organic light emitting diode (OLED) display is illustrated as the display device 101, but the first exemplary embodiment is not meant to be limited thereto. Thus, for example, a liquid crystal display (LCD) may be employed within the scope of the present invention, in which the skilled person in the art can easily modify embodiments thereof.

As shown in FIGS. 1 and 2, the display device 101 according to the first exemplary embodiment includes a plurality of thin film transistors 10 and 20, an organic light emitting diode (OLED) 70, a capacitor 90, and the like, formed at each pixel area on a substrate 111. The display device 101 further includes a gate line 171, as well as a data line 131 and a common power line 132 insulatedly crossing the gate line 171. Here, the pixel area refers to an area where a pixel is formed, and a pixel is a minimum (e.g., indivisible) unit for displaying an image by the display device 101. The pixel area may be defined by using the gate line 171, the data line 131, and the common power line 132 as boundaries, but the pixel area need not be defined in this way.

The organic light emitting element 70 includes a pixel electrode 710, an organic light emission layer 720 formed on the pixel electrode 710, and a common electrode 730 formed on the organic light emission layer 720. Holes and electrons are injected into the organic light emission layer 720 from the pixel electrode 710 and the common electrode 730. When excitons, which are formed as the injected holes and electrons are combined, fall to a base state from an excited state, light emission occurs.

The capacitor 90 includes a pair of capacitor electrodes 139 and 159 with a gate insulating layer pattern 140 interposed therebetween. The gate insulating layer pattern 140 is a dielectric material. Storage capacitance is determined by electric charges charged in the capacitor 90 and the voltage between the capacitor electrodes 139 and 159.

The plurality of thin film transistors (TFTs) includes a first TFT 10 serving as a switching element and a second TFT 20 driving the OLED 70. Each TFT (10 and 20) includes a gate electrode (133 and 134), a source electrode (175 and 176), and a drain electrode (177 and 178).

The first TFT 10 selects whether or not a pixel (e.g., a corresponding pixel) is illuminated. The gate electrode 133 of the first TFT 10 is coupled with the gate line 171. The source electrode 175 of the first TFT 10 is coupled with the data line 131, and the drain electrode 177 of the first TFT 10 is coupled with one (e.g., the first) capacitor electrode 139 of the capacitor 90 and the gate electrode 134 of the second TFT 20.

The second TFT 20 applies a driving signal to the pixel electrode 710, thereby causing the OLED 70 in the selected pixel to emit light. The other (e.g., second) capacitor electrode 159 of the capacitor 90 is coupled with the source electrode 176 of the second TFT 20. Also, the source electrode 176 of the second TFT 20 is coupled with the common power line 132. The drain electrode 178 of the second TFT 20 is coupled with the pixel electrode 710 of the OLED 70.

With the abovementioned structure, the first TFT 10 is operated by a gate voltage applied to the gate line 171, and serves to transfer a data voltage applied to the data line 131 to the second TFT 20. A voltage corresponding to a difference between a common voltage applied to the second TFT 20 (e.g., the source electrode 176 of the second TFT 20) from the common power line 132 and the data voltage transferred from the first TFT 10 is stored in the capacitor 90, and current corresponding to the voltage stored in the capacitor 90 is supplied to the OLED 70 through the second TFT 20. Upon receiving the current, the OLED 70 emits light.

The display device 101 according to the first exemplary embodiment of the present invention will now be described according to a stacking order with reference to FIG. 2.

The substrate 111 is formed as a transparent insulating substrate made of glass, quartz, ceramic, plastic, and the like. However, the first exemplary embodiment is not limited thereto, and the substrate 111 may be formed as a metal substrate made of stainless steel or the like. Also, when the substrate 111 is made of plastic or the like, it may be formed as a flexible substrate.

A buffer layer 120 is formed on the substrate 111. The buffer layer 120 may be formed through, for example, chemical vapor deposition or physical vapor deposition, and may have a uni-layered structure or a multi-layered structure including various insulating layers, such as a silicon oxide film, a silicon nitride film, and the like, which are known to one skilled in the art.

The buffer layer 120 serves to reduce or prevent moisture or impurities generated from the substrate 111 from spreading or infiltrating into the layer formed thereon, and also serves to smooth (e.g., planarize) the surface and regulate a rate of heat transfer (e.g., a heat transfer speed) during a crystallization process to thus accomplish desirable crystallization.

Meanwhile, the buffer layer 120 may alternatively be omitted according to types and processing conditions of the substrate 111.

A first conductive film pattern 130 is formed on the buffer layer 120. The first conductive film pattern 130 includes the gate electrodes 133 and 134 and the first capacitor electrode 139. Also, the first conductive film pattern 130 may further include the data line 131 and/or the common power line 132 (see FIG. 1). However, the first exemplary embodiment is not meant to be limited thereto. For example, the first conductive film pattern 130 may further include the gate line 171 instead of the data line 131 and the common power line 132.

Figure 3:
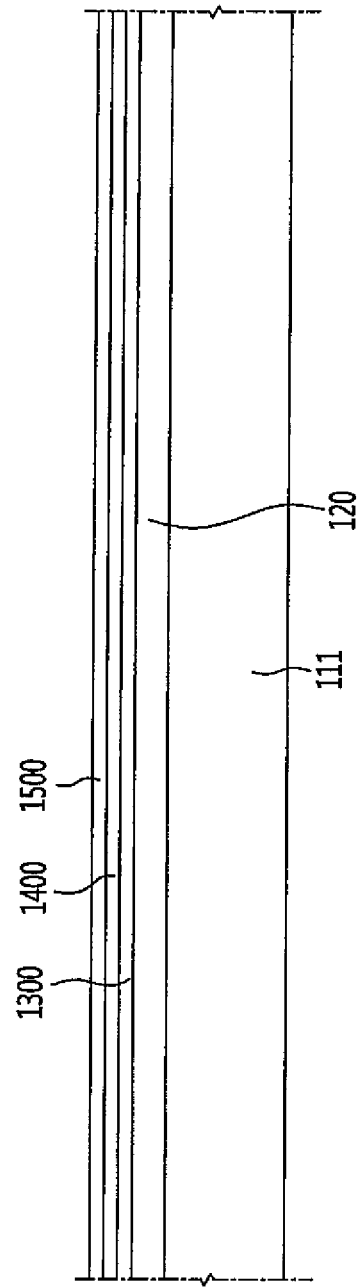
FIGS. 3 to 11 are cross-sectional views and layout views sequentially showing a method of manufacturing the display device of the first exemplary embodiment of the present invention illustrated in FIGS. 1 and 2.

The first conductive film pattern 130 includes a first metal layer 1300 (see FIG. 3). The first conductive film pattern 130 is formed by forming the first metal layer 1300 and then patterning the first metal layer 1300 through a photolithography process. The first conductive film pattern 130 may be patterned together with the gate insulating layer pattern 140 and a polycrystalline silicon film pattern 150 (to be described below) through the photolithography process using a single mask. The photolithography process may include a dual-exposure process or a halftone exposure process.

The first metal layer 1300 may be formed by including one or more of various metal materials, such as, for example, molybdenum (Mo), chromium (Cr), aluminum (Al), silver (Ag), titanium (Ti), tantalum (Ta), tungsten (W), and the like, as known to the skilled person in the art.

Referring to FIGS. 1 and 2, the gate insulating layer pattern 140, excluding a plurality of first contact holes 641 and 649 exposing a portion or portions of the first conductive film pattern 130, is formed to have the same (e.g., a similar) pattern as the first conductive film pattern 130. For example, the gate insulating layer pattern 140 is not formed at any area where the first conductive film pattern 130 is not formed. The gate insulating layer pattern 140 is not formed directly on the buffer layer 120.

The gate insulating layer pattern 140 may be formed by including one or more of various insulating materials, such as tetraethyl orthosilicate (TEOS), silicon nitride (SiNx), silicon oxide ($SiO_2$), and the like, known to the skilled person in the art.

The polycrystalline silicon film pattern 150 is formed on the gate insulating layer pattern 140. The polycrystalline silicon film pattern 150 includes active layers 153 and 154 and the second capacitor electrode 159. The polycrystalline silicon film pattern 150 may be formed by forming a polycrystalline silicon film 1500 (see FIG. 3) and then patterning it through the foregoing photolithography process. The polycrystalline silicon film 1500 may be formed by forming an amorphous silicon film and then crystallizing it.

The first capacitor electrode 139, the second capacitor electrode 159, and the gate insulating layer pattern 140 between the first and second capacitor electrodes 139 and 159 constitute the capacitor 90.

An interlayer insulating layer 160 is formed on the polycrystalline silicon film pattern 150. Specifically, the interlayer insulating layer 160 is formed across the polycrystalline silicon film pattern 150 on the buffer 120. In this case, the plurality of first contact holes 641 and 649 are penetratingly formed at the gate insulating layer pattern 140 and the interlayer insulating layer 160 to expose a portion or portions of the first conductive film pattern 130. A plurality of second contact holes 605, 606, 607, and 608 are penetratingly formed at the interlayer insulating layer 160 to expose a portion or portions of the polycrystalline silicon film pattern 150.

Impurities are doped on a second conductive film pattern 170 exposed through the plurality of second contact holes 605, 606, 607, and 608. In the described embodiment, the impurities are doped on a partial area of the active layers 153 and 154. The impurities may be P-type impurities including aluminum, boron, gallium, indium, and the like. However, the present invention is not meant to be limited thereto, and N-type impurities may be doped according to the purpose (e.g., design) of the TFTs 10 and 20.

Also, the interlayer insulating layer 160 includes a first interlayer insulating layer 1601 and a second interlayer insulating layer 1602. The first and second interlayer insulating layers 1601 and 1062 may have different refractive indexes. When the first and second interlayer insulating layers 1601 and 1602 have different refractive indexes, the display device 101 may obtain (e.g., exhibit) a mirror effect by light being reflected from the interface between the first and second interlayer insulating layers 1601 and 1602. For example, one of the first and second interlayer insulating layers 1601 and 1602 may be made of silicon nitride having a relatively high refractive index, and the other may be made of silicon oxide having a relatively low refractive index. However, the first exemplary embodiment is not meant to be limited thereto. That is, the interlayer insulating layer 160 may be formed by variably combining one or more of various inorganic films and organic films known to the skilled person in the art.

The second conductive film pattern 170 is formed on the interlayer insulating layer 160. The second conductive film pattern 170 includes the source electrodes 175 and 176, the drain electrodes 177 and 178, and the pixel electrode 710. The second conductive film pattern 170 may further include the gate line 171 (see FIG. 1). However, the first exemplary embodiment is not meant to be limited thereto. That is, the second conductive film pattern 170 may further include the data line 131 and/or the common power line 132, instead of the gate line 171.

The source electrodes 175 and 176 and the drain electrodes 177 and 178 are coupled with the active layers 153 and 154 via the plurality of second contact holes 605, 606, 607, and 608. The pixel electrode 710 extends from the drain electrode 178 of the second TFT 20.

Also, a portion or portions of the second conductive film pattern 170 is/are coupled with a portion of the first conductive film pattern 130 via the plurality of first contact holes 641 and 649.

The second conductive film pattern 170 includes a transparent conductive layer 1701 and a second metal layer 1702, which is formed on a partial area of the transparent conductive layer 1701. For example, the source electrodes 175 and 176, the drain electrodes 177 and 178, and the gate line 171 (see FIG. 1) are formed as multiple layers including the transparent conductive layer 1701 and the second metal layer 1702, while the pixel electrode 710 is formed as the transparent conductive layer 1701. Thus, the display device 101 may also discharge light toward the rear side, that is, toward the substrate 111. However, the first exemplary embodiment is not meant to be limited thereto, for example, portions of the source electrodes 175 and 176 and the drain electrodes 177 and 178 may also be formed as transparent conductive layers 1701.

The transparent conductive layer 1701 may include, for example, one or more of indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The second metal layer 1702 may be made of various metal materials known to the skilled person in the art, as may the first metal layer 1300 (see FIG. 3).

Also, the second conductive film pattern 170 may be formed through a photolithography process including a dual-exposure process or a halftone exposure process.

The foregoing gate electrodes 133 and 134, active layers 153 and 154, source electrodes 175 and 176, and drain electrodes 177 and 178 constitute the TFTs 10 and 20.

A pixel defining film 180 is formed on the second conductive film pattern 170. The pixel defining film 180 includes an opening 185 exposing a portion of the pixel electrode 710. The pixel defining film 180 may be made of various organic or inorganic materials known to the skilled person in the art. For example, the pixel defining film 180 may be formed by patterning a photosensitive organic film and then thermosetting (heat curing) or UV curing the same.

The organic light emission layer 720 is formed on the pixel electrode 710, and the common electrode 730 is formed on the organic light emission layer 720. The pixel electrode 710, the organic light emission layer 720, and the common electrode 730 constitute the OLED 70. The opening 185 of the pixel defining film 180 where the pixel electrode 710, the organic light emission layer 720, and the common electrode 730 are sequentially stacked becomes a light emission area (e.g., a substantial light emission area) of the OLED 70.

With such a configuration, the display device 101 according to the first exemplary embodiment can have a simple structure, which contributes to shortening (e.g., simplifying) a manufacturing process.

For example, the first conductive film pattern 130, the gate insulating layer pattern 140, and the polycrystalline silicon film pattern 150, including the active layers 153 and 154, may be formed together through photolithography using a single mask. Also, the drain electrode 178 of the second TFT 20 and the pixel electrode 710 of the OLED 70 may be formed through photolithography using a single mask.

Thus, according to the first exemplary embodiment of the present invention, high productivity of a large-scale display device 101 can be effectively maintained.

Additionally, the display device 101 can obtain the mirror effect through the first and second interlayer insulating layers 1601 and 1602 by each having a different refractive index.

A method of manufacturing the display device 101 of the first exemplary embodiment will now be described with reference to FIGS. 3 to 11.

First, as shown in FIG. 3, the buffer layer 120, the first metal layer 1300, a gate insulating layer 1400, and the polycrystalline silicon film 1500 are sequentially formed on the substrate 111.

The buffer layer 120 may be formed as a multi-layered film by using various insulating materials, such as silicon nitride (SiNx) and silicon oxide ($SiO_2$), which are known to the skilled person in the art.

The polycrystalline silicon film 1500 may be formed by depositing an amorphous silicon film on the gate insulating layer 1400 and then crystallizing the same. The amorphous silicon film may be crystallized by using various methods, such as by applying heat or a laser, or by using a metal catalyst, methods which are known to the skilled person in the art.

Figure 4:
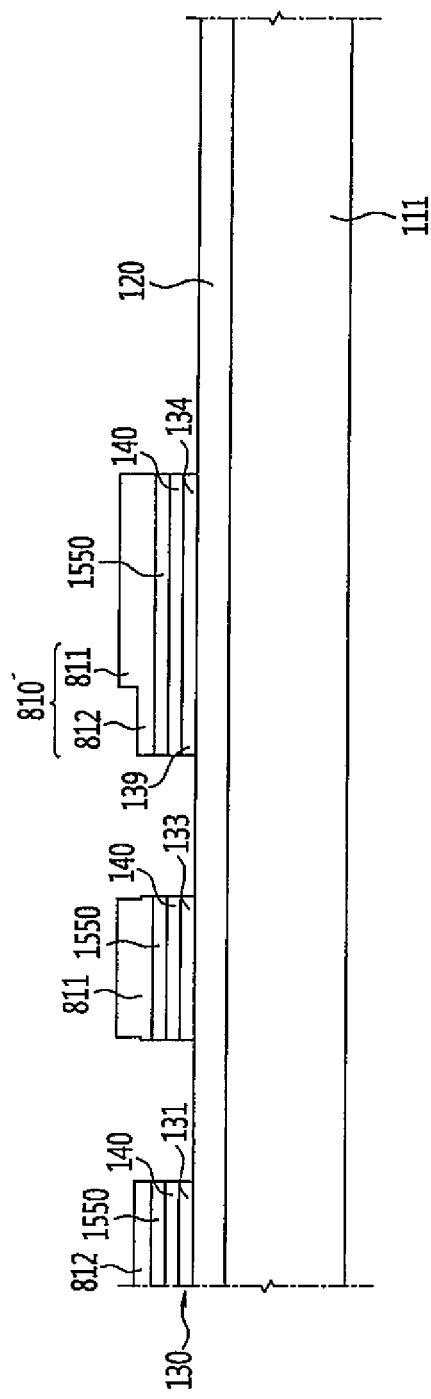

Next, and also referring to FIG. 4, a first photosensitive film pattern 810 is formed on the polycrystalline silicon film 1500 by using a mask. The first photosensitive film pattern 810 may be formed through a dual-exposure process or a halftone exposure process. The first photosensitive film pattern 810 includes a first large thickness portion 811 and a first small thickness portion 812.

Then, primary etching is performed through the first photosensitive film pattern 810 on the first metal layer 1300, the gate insulating layer 1400, and the polycrystalline silicon film 1500, to form the first conductive film pattern 130, the gate insulating layer pattern 140, and a polycrystalline silicon film intermediate 1550, respectively.

Figure 5:
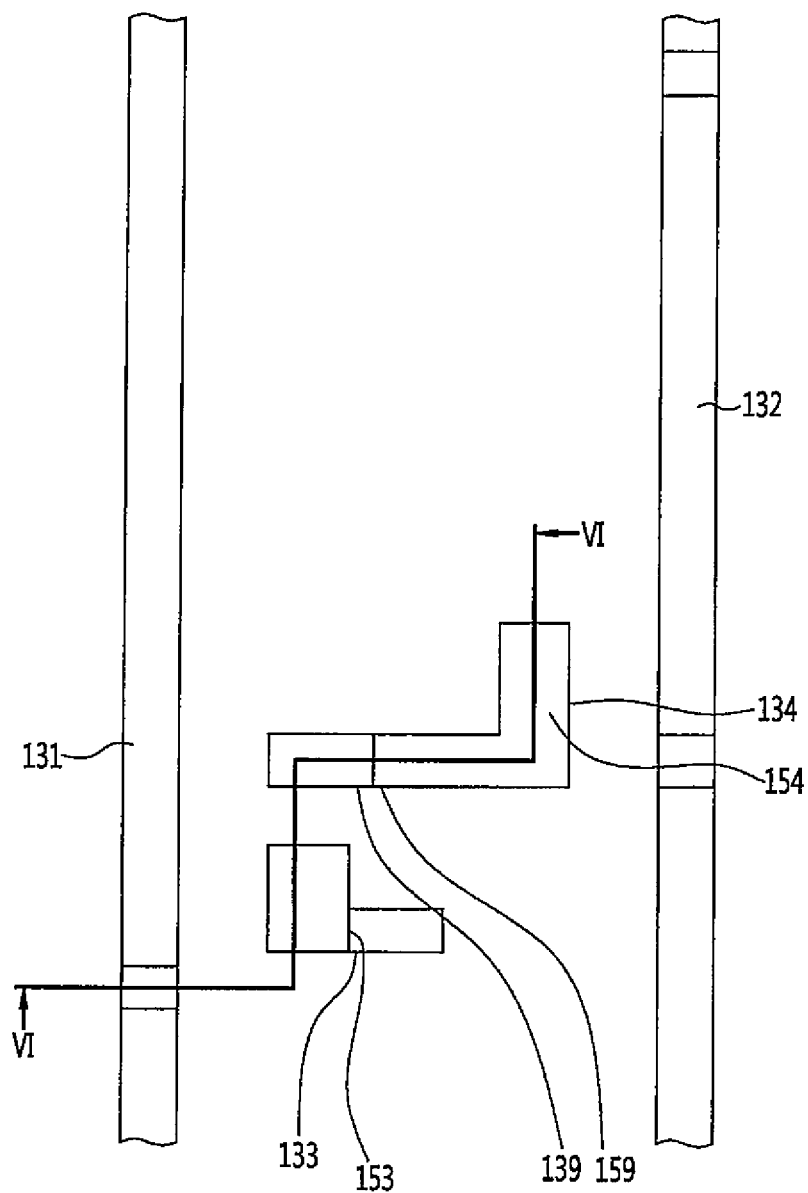
Figure 6:
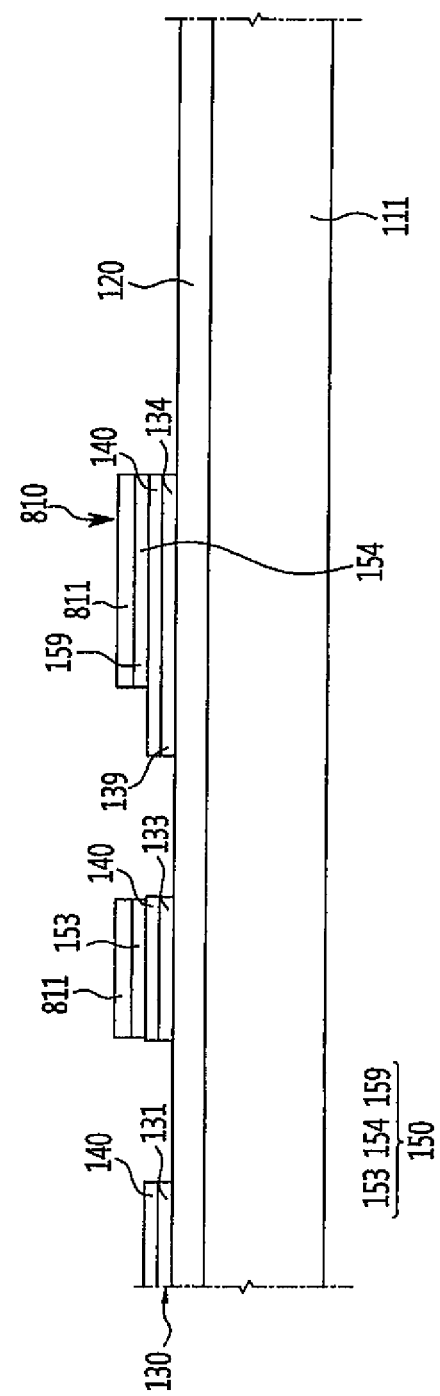

Thereafter, as shown in FIGS. 5 and 6, the first small thickness portion 812 of the first photosensitive film pattern 810 is removed. The thickness of the first large thickness portion 811 may be slightly reduced. Then, the polycrystalline silicon film intermediate 1550 is secondarily etched through the first large thickness portion 811 to from the polycrystalline silicon film pattern 150.

Accordingly, the first conductive film pattern 130, the gate insulating layer pattern 140, and the polycrystalline silicon film pattern 150 can be formed through photolithography using the single mask. The first conductive film pattern 130 includes the gate electrodes 133 and 134 and the first capacitor electrode 139, and may also include the data line 131 and the common power line 132 (see also FIG. 1). The gate insulating layer pattern 140, except for the first contact holes 641 and 649 (see FIG. 2), is formed to have the same pattern as the polycrystalline silicon layer pattern 150. The polycrystalline silicon layer pattern 150 includes the active layers 153 and 154 and the second capacitor electrode 159.

Figure 7:
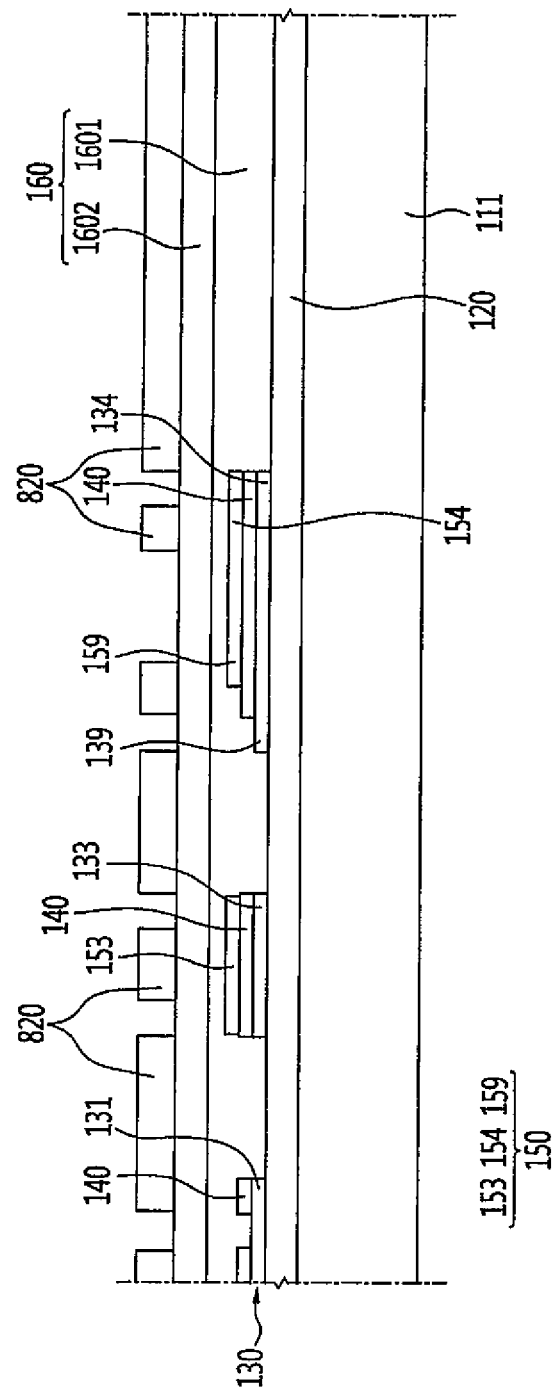

Then, as shown in FIG. 7, the first interlayer insulating layer 1601 and the second interlayer insulating layer 1602 may be sequentially formed on the polycrystalline silicon film pattern 150. The first and second interlayer insulating layers 1601 and 1602 may have different refractive indices. For example, one of the first and second interlayer insulating layers 1601 and 1602 may be formed of silicon nitride having a relatively high refractive index, and the other may be formed of silicon oxide having a relatively low refractive index.

Figure 8:
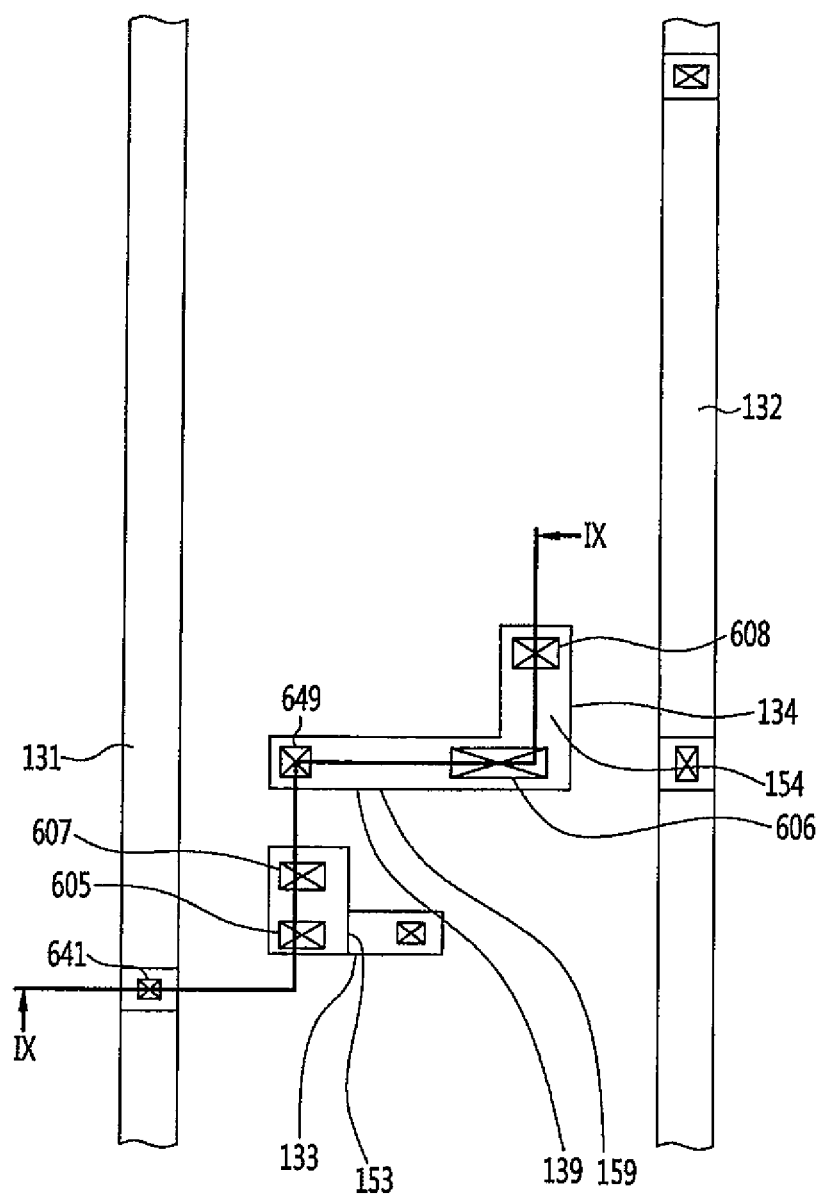
Figure 9:
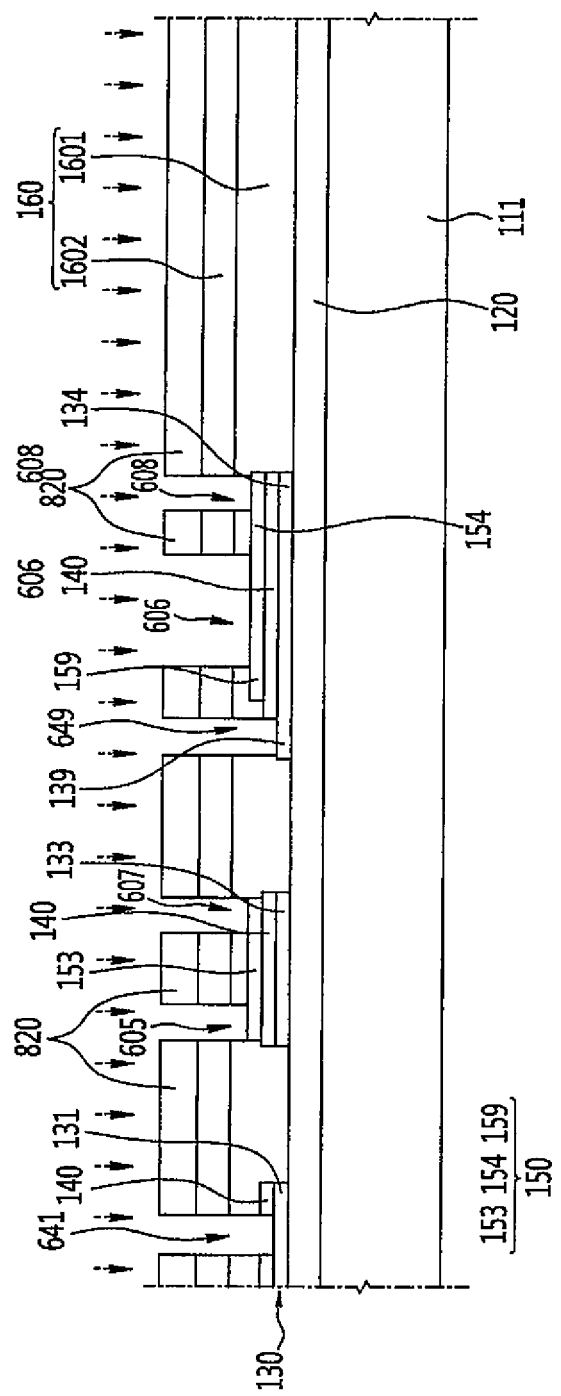

Next, a second photosensitive film pattern 820 is formed on the second interlayer insulating layer 1602. Then, as shown in FIGS. 8 and 9, the plurality of first contact holes 641 and 649 and the plurality of second contact holes 605, 606, 607, and 608 are formed through photolithography using the second photosensitive film pattern 820. The photolithography is performed by using another mask.

The plurality of first contact holes 641 and 649 are penetratingly formed at the interlayer insulating layer 160 and the gate insulating layer pattern 140 to expose a portion or portions of the first conductive film pattern 130. Specifically, the first contact holes 641 and 649 expose portions of the data line 131, the common power line 132 (see also FIG. 1), the first capacitor electrode 139, and the like.

The plurality of second contact holes 605, 606, 607, and 608 are penetratingly formed at the interlayer insulating layer 160 to expose a portion or portions of the polycrystalline silicon film pattern 150. For example, the second contact holes 605, 606, 607, and 608 expose portions of the active layers 153 and 154.

Thereafter, impurities are doped on a portion or portions of the polycrystalline silicon film pattern 150 through ion implantation. The impurities may be P-type impurities, but the first exemplary embodiment is not meant to be limited thereto. That is, N-type impurities may also be doped as necessary or desired. Thus, contact resistance with the second conductive film pattern 170 (see FIG. 2) can be reduced at the impurity-doped portion(s) of the polycrystalline silicon film pattern 150.

Figure 10:
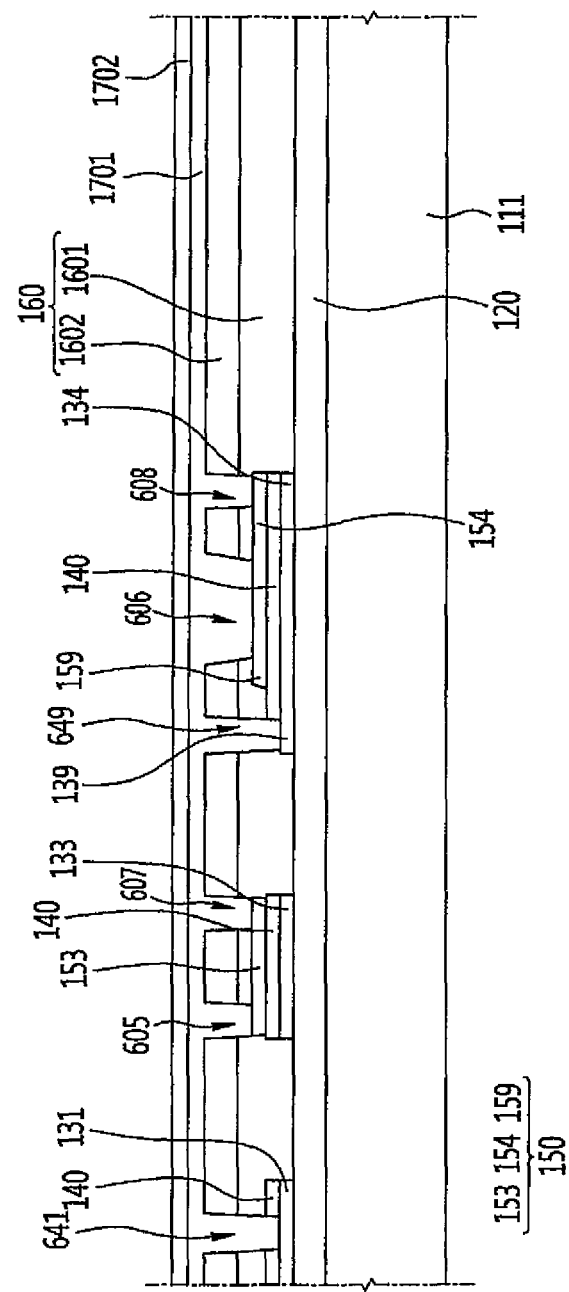

Subsequently, as shown in FIG. 10, the transparent conductive layer 1701 and the second metal layer 1702 are sequentially stacked on the interlayer insulating layer 160. The transparent conductive layer 1701 is in contact with a portion or portions of the first conductive film pattern 130 (see FIG. 2) via the plurality of first contact holes 641 and 649, and is also in contact with a portion or portions of the polycrystalline silicon film pattern 150 via the plurality of second contact holes 606, 607, 608, and 609.

Figure 11:
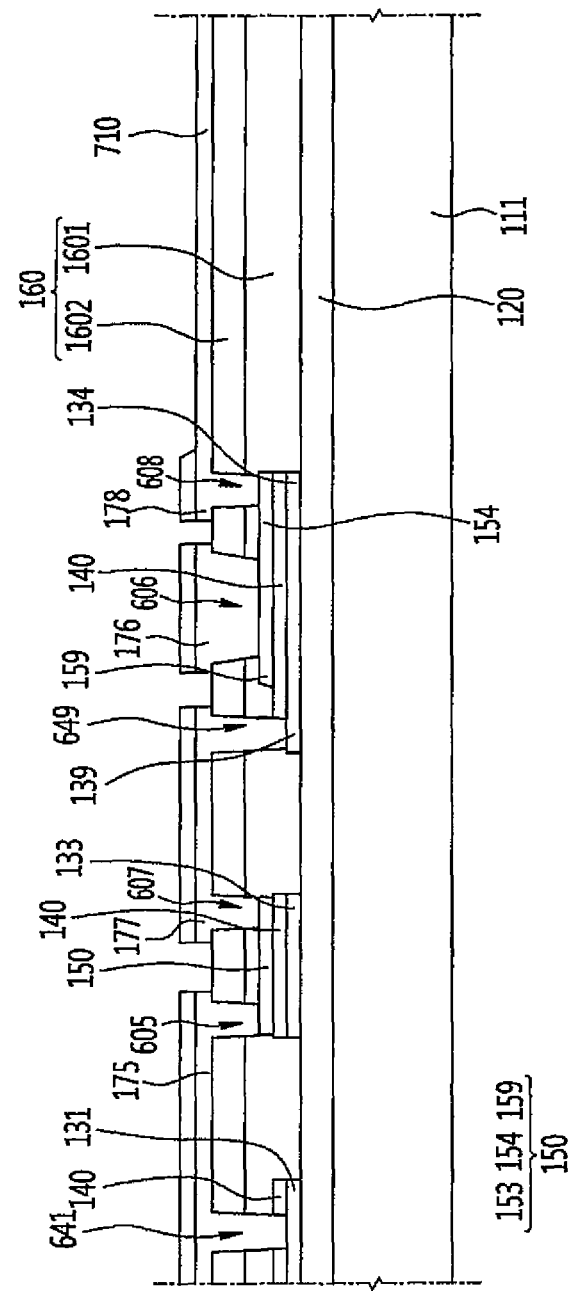

Thereafter, and also referring to FIG. 11, the transparent conductive layer 1701 and the second metal layer 1702 are patterned through photolithography using yet another mask to form the second conductive film pattern 170 (e.g., see FIG. 2).

The second conductive film pattern 170 includes the gate line 171 (e.g., see FIG. 1), the source electrodes 175 and 176, and the drain electrodes 177 and 178 formed as both the transparent conductive layer 1701 and the second metal layer 1702, as well as the pixel electrode 710 formed as the transparent conductive layer 1701.

Then, as shown in FIG. 2, the pixel defining film 180 is formed on the second conductive film pattern 170. The pixel defining film 180 includes the opening 185 exposing a portion of the pixel electrode 710. The opening 185 of the pixel defining film 180 is formed through photolithography using another mask.

The organic light emission layer 720 and the common electrode 730 are sequentially formed on the pixel electrode 710. The pixel electrode 710, the organic light emission layer 720, and the common electrode 730 constitute the OLED 70.

The display device 101 according to the first exemplary embodiment can be manufactured through the manufacturing method of the exemplary embodiment described above. That is, the manufacturing process of the display device 101 can be shortened or simplified by reducing or minimizing the number of masks used. Thus, high productivity of the large scale display device 101 can be effectively maintained according to the first exemplary embodiment.

Additionally, the display device 101 can obtain a mirror effect through the first and second interlayer insulating layers 1601 and 1602 having different refractive indices.

A method of manufacturing a display device according to a second exemplary embodiment will now be described with reference to FIGS. 12 and 13.

The processes of forming the interlayer insulating layer 160, forming the plurality of first contact holes 641 and 649, and forming the plurality of second contact holes 605, 606, 607, and 608 according to the second exemplary embodiment are the same as those of the first exemplary embodiment.

Figure 12:
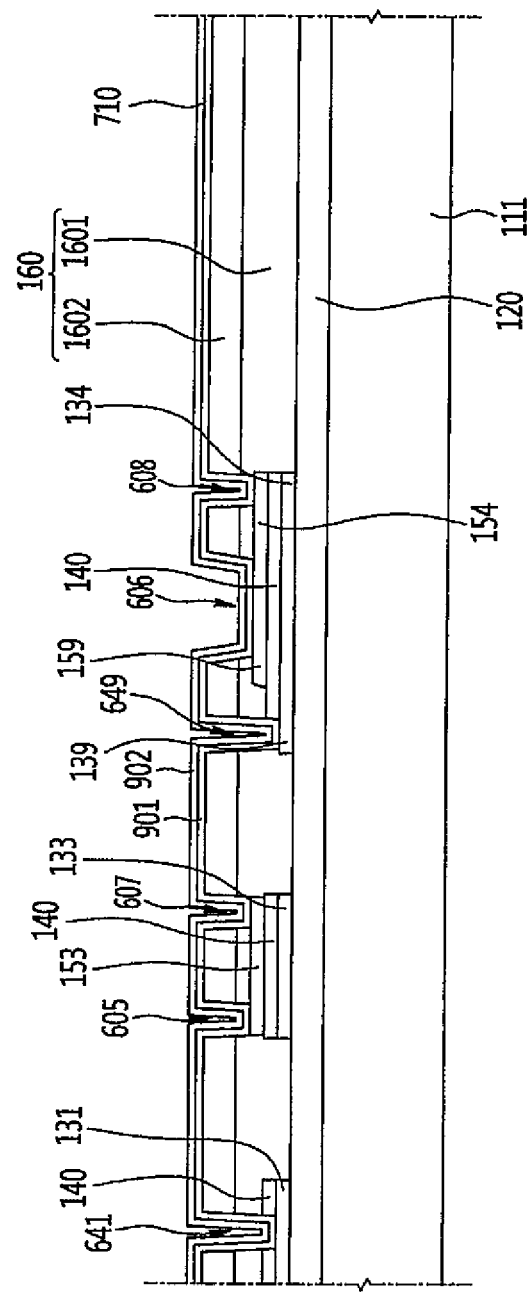
FIGS. 12 and 13 are cross-sectional views sequentially showing a method of manufacturing a display device according to a second exemplary embodiment of the present invention.

As shown in FIG. 12, an aluminum metal film 901 is formed on the polycrystalline silicon film pattern 150 exposed through the plurality of second contact holes 605, 606, 607, and 608. In this case, the thinner the aluminum metal film 901 is, the better. This is because, as the aluminum metal film 901 becomes thicker, the aluminum metal film 901 becomes more apt to reflow or whiten.

Also, for example, rather than the formation of the aluminum metal film 901, aluminum metal particles may be dusted on the polycrystalline silicon film pattern 150 exposed through the plurality of second contact holes 605, 606, 607, and 608.

The aluminum metal film 901 or the aluminum metal particles may be formed through one or more of atomic layer deposition (ALD), chemical vapor deposition (CVD), and sputtering. Among them, the ALD is advantageous in that it can allow for a formation of a thinner film and precise regulation of the film thickness. In particular, when the aluminum metal particles are dusted, there is a limitation in using the CVD and sputtering.

Next, a protective layer 902 may be formed to cover the aluminum metal film 901 or the aluminum metal particles to thus restrain (e.g., reduce or prevent) oxidization of the aluminum metal film 901 or the aluminum metal particles. For example, the protective layer 902 may be a metal film including molybdenum (Mo). Alternatively, the protective layer 902 may be omitted.

Then, the aluminum metal film 901 or the aluminum metal particles are thermally treated. In this case, 1 percent or less of the polycrystalline silicon film is covered by aluminum. That is, aluminum is doped on the polycrystalline silicon film pattern 150 exposed through the plurality of second contact holes 605, 606, 607, and 608. Aluminum is a P-type impurity.

Also, the thermal treatment may be performed at a temperature range of 200 degrees Celsius to 400 degrees Celsius. If the temperature of the thermal treatment is lower than 200 degrees Celsius, it would be difficult to use aluminum for the polycrystalline silicon film. Meanwhile, if the temperature of the thermal treatment exceeds 400 degrees Celsius, other configurations may be thermally damaged or reflow may occur.

The thermal treatment of the aluminum metal film 901 or the aluminum metal particles may be performed through a separate process, or may be performed indirectly or incidentally in manufacturing other elements in a follow-up process. For example, the aluminum metal film 901 or the aluminum metal particles may be thermally treated indirectly or incidentally in the process of thermosetting a photosensitive film to form the second conductive film pattern 170, the pixel defining film 180, or the like.

Figure 13:
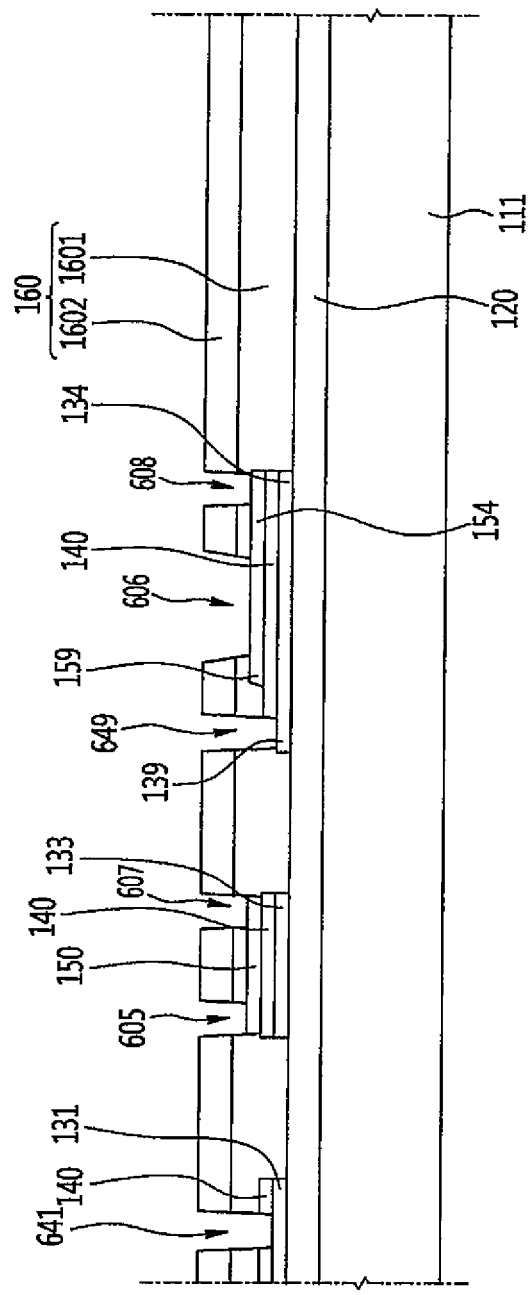

Next, as shown in FIG. 13, the aluminum metal film 901 or the aluminum metal particles may be etched to be removed. When the protective layer 902 has been formed, the protective layer 902 may be removed along with the aluminum metal film 901 or the aluminum metal particles. However, the process of etching to remove the aluminum metal film 901 or the aluminum metal particles may be omitted. For example, when thermal treatment is performed such that the aluminum metal film 901 or the aluminum metal particles are not oxidized, the process of etching to remove the aluminum metal film 901 or the aluminum metal particles may be omitted.

For example, when the aluminum metal film 901 or the aluminum metal particles are formed and the second conductive film pattern 170 is sequentially formed on the aluminum metal film 901 or the aluminum metal particles, the second conductive film pattern 170 acts as a protective layer to restrain (e.g., reduce or prevent) the aluminum metal film 901 or the aluminum metal particles from being oxidized. Thus, elimination of the aluminum metal film 901 or the aluminum metal particles may be unnecessary.

The processes following doping of impurities on a portion or portions of the polycrystalline silicon film pattern 150 are the same as those of the first exemplary embodiment.

The large scale display device 101 can be more effectively manufactured through the manufacturing method of the embodiments described above. Generally, it is not easy to apply the impurity doping to the manufacturing process of the large scale display device through ion implantation. However, the method of manufacturing a display device according to the second exemplary embodiment of the present invention, in which the aluminum metal film 901 or the aluminum metal particles are formed and thermally treated to use the impurities on the active layers 153 and 154, can be easily applicable to the manufacturing process even when the display device 101 is increased in size.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

DESCRIPTION OF SOME OF THE REFERENCE CHARACTERS IN THE DRAWINGS

| | |
|---|---|
| 10, 20: thin film transistor | 70: organic light emitting diode |
| 90: capacitor | 101: display device |
| 111: substrate | 120: buffer layer |
| 130: first conductive film pattern | 131: data line |
| 132: common power line | 133, 134: gate electrodes |
| 139: first capacitor electrode | 140: gate insulating layer pattern |
| 150: polycrystalline silicon film pattern | 153, 154: active layer |
| 159: second capacitor electrode | 160: interlayer insulating layer |
| 170: second conductive film pattern | 171: gate line |
| 175, 177: source electrode | 176, 178: drain electrode |
| 180: pixel defining film | 185: opening |
| 605, 606, 607, 608: second contact hole | |
| 641, 649: first contact hole | 710: pixel electrode |
| 720: organic light emission layer | 730: common electrode |
| 810: first photosensitive film pattern | 820: second photosensitive film pattern |

What is claimed is:

1. A method of manufacturing a display device, the method comprising:
   sequentially stacking a first metal layer, a gate insulating layer, and a polycrystalline silicon film on a substrate;
   patterning the polycrystalline silicon film, the gate insulating layer, and the first metal layer through a photolithography process using a single mask to pattern a polycrystalline silicon film pattern, a gate insulating layer pattern, and a first conductive film pattern;
   placing an interlayer insulating layer on the polycrystalline silicon film pattern;
   sequentially stacking a transparent conductive layer and a second metal layer on the interlayer insulating layer; and
   patterning the transparent conductive layer and the second metal layer as a second conductive film pattern.

2. The method of claim 1, wherein the first conductive film pattern comprises a gate electrode and a first capacitor electrode, the polycrystalline silicon film pattern comprises an active layer and a second capacitor electrode, and the second conductive film pattern comprises a source electrode, a drain electrode, and a pixel electrode.

3. The method of claim 2, wherein the source electrode and the drain electrode each comprise a portion of the transparent conductive layer and a portion of the second metal layer, and the pixel electrode comprises a portion of the transparent conductive layer.

4. The method of claim 2, wherein the first conductive film pattern further comprises at least one of a data line or a common power line, and the second conductive film pattern further comprises a gate line.

5. The method of claim 1, wherein the gate insulating layer pattern and the interlayer insulating layer have a plurality of first contact holes exposing a portion of the first conductive film pattern, and the interlayer insulating layer has a plurality of second contact holes exposing a portion of the polycrystalline silicon film pattern.

6. The method of claim 5, wherein the gate insulating layer pattern, except for the plurality of first contact holes, has substantially the same pattern as the first conductive film pattern.

7. The method of claim 6, further comprising doping impurities on the polycrystalline silicon film pattern exposed through the plurality of second contact holes.

8. The method of claim 7, wherein the impurities comprise P-type impurities or N-type impurities.

9. The method of claim 7, wherein the doping impurities comprises doping using an ion implantation process.

10. The method of claim 7, wherein the doping impurities comprises depositing an aluminum (Al) metal film, or dusting aluminum (Al) metal particles, on the polycrystalline silicon film pattern exposed through the plurality of second contact holes, and performing a thermal treatment on the aluminum metal film or the aluminum metal particles.

11. The method of claim 10, wherein a temperature of the thermal treatment ranges from about 200 degrees Celsius to about 400 degrees Celsius.

12. The method of claim 10, further comprising removing the aluminum metal film or the aluminum metal particles.

13. The method of claim 10, further comprising forming a protective layer to cover the aluminum metal film or the aluminum metal particles before performing the thermal treatment to reduce oxidization of the aluminum metal film or the aluminum metal particles.

14. The method of claim 13, wherein the protective layer comprises molybdenum (Mo).

15. The method of claim 10, wherein the depositing the aluminum metal film, or dusting the aluminum metal particles, the polycrystalline silicon film pattern exposed through the plurality of second contact holes comprises one or more of atomic layer deposition (ALD), chemical vapor deposition (CVD), and sputtering.

16. The method of claim 1, wherein the photolithography process comprises a dual-exposure process or a halftone exposure process.

17. The method of claim 1, further comprising:
    forming a pixel defining film having an opening exposing a portion of a pixel electrode on the second conductive film pattern;
    forming an organic light emission layer on the pixel electrode; and
    forming a common electrode on the organic light emission layer.

18. The method of claim 1, wherein the interlayer insulating layer comprises a first interlayer insulating layer and a second interlayer insulating layer having a different refractive index from that of the first interlayer insulating layer.

19. The method of claim 18, wherein the interlayer insulating layer comprises one or more of inorganic films and organic films.

* * * * *